United States Patent
Uno

(10) Patent No.: US 7,208,978 B2
(45) Date of Patent: Apr. 24, 2007

(54) SEMICONDUCTOR DEVICE

(75) Inventor: Osamu Uno, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 138 days.

(21) Appl. No.: 11/116,358

(22) Filed: Apr. 28, 2005

(65) Prior Publication Data

US 2005/0189963 A1   Sep. 1, 2005

Related U.S. Application Data

(63) Continuation of application No. PCT/JP03/06714, filed on May 28, 2003.

(51) Int. Cl.
   *H03K 19/0175* (2006.01)
(52) U.S. Cl. .......... 326/81; 326/57; 326/113; 326/83; 326/80
(58) Field of Classification Search ........... 326/56, 326/57, 81, 86
   See application file for complete search history.

(56) References Cited

U.S. PATENT DOCUMENTS

| | | | |
|---|---|---|---|
| 5,450,025 A | 9/1995 | Shay | |
| 5,543,733 A | 8/1996 | Mattos et al. | |
| 5,555,149 A * | 9/1996 | Wert et al. | 361/18 |
| 5,831,449 A | 11/1998 | Shigehara et al. | |
| 5,933,027 A | 8/1999 | Morris et al. | |
| 5,966,026 A | 10/1999 | Partovi et al. | |
| 6,028,450 A | 2/2000 | Nance | |
| 6,150,843 A | 11/2000 | Shiffer et al. | |
| 6,320,415 B1 | 11/2001 | Lee | |
| 6,329,842 B1 | 12/2001 | Naritomi et al. | |
| 6,437,958 B1 | 8/2002 | Duncan et al. | |
| 6,781,414 B2 * | 8/2004 | Uno | 326/80 |

FOREIGN PATENT DOCUMENTS

| | | |
|---|---|---|
| EP | 0 305 676 A2 | 3/1989 |
| JP | 64-072618 | 3/1989 |
| JP | 07-066710 | 3/1995 |
| JP | 08-251004 | 9/1996 |
| JP | 8-511136 | 11/1996 |
| JP | 9-501282 | 2/1997 |
| JP | 11-274911 | 10/1999 |
| JP | 11-317652 | 11/1999 |
| JP | 2000-312146 A1 | 11/2000 |
| JP | 2001-313559 A | 11/2001 |
| JP | 2001-313559 A1 | 11/2001 |

* cited by examiner

*Primary Examiner*—Vibol Tan
(74) *Attorney, Agent, or Firm*—Arent Fox PLLC

(57) ABSTRACT

In a semiconductor device in which an applying voltage higher than a power supply voltage VDD is inputted to a terminal BUS, when the voltage VBUS is less than a voltage of the power supply voltage VDD plus a threshold voltage Vthp, a voltage obtained by subtracting a threshold voltage Vthn from the power supply voltage VDD is applied to the gate terminal G4 and the PMOS transistor P4 becomes conductive. The power supply voltage VDD is supplied to the gate terminal G2 to turn the PMOS transistor P2 off. When the voltage VBUS is equal to or higher than the voltage of the power supply voltage VDD plus the threshold voltage Vthp, the voltage VBUS is supplied to the gate terminal G4 to turn the PMOS transistor P4 off, and the PMOS transistor P3 conducts and supplies the voltage VBUS to the gate terminal G2 to turn the PMOS transistor P4 off. The voltage level is correctly maintained without an undesirable leak current from the terminal BUS regardless of the applying voltage VBUS.

17 Claims, 13 Drawing Sheets

FIG.11 -- PRIOR ART --

-- PRIOR ART --

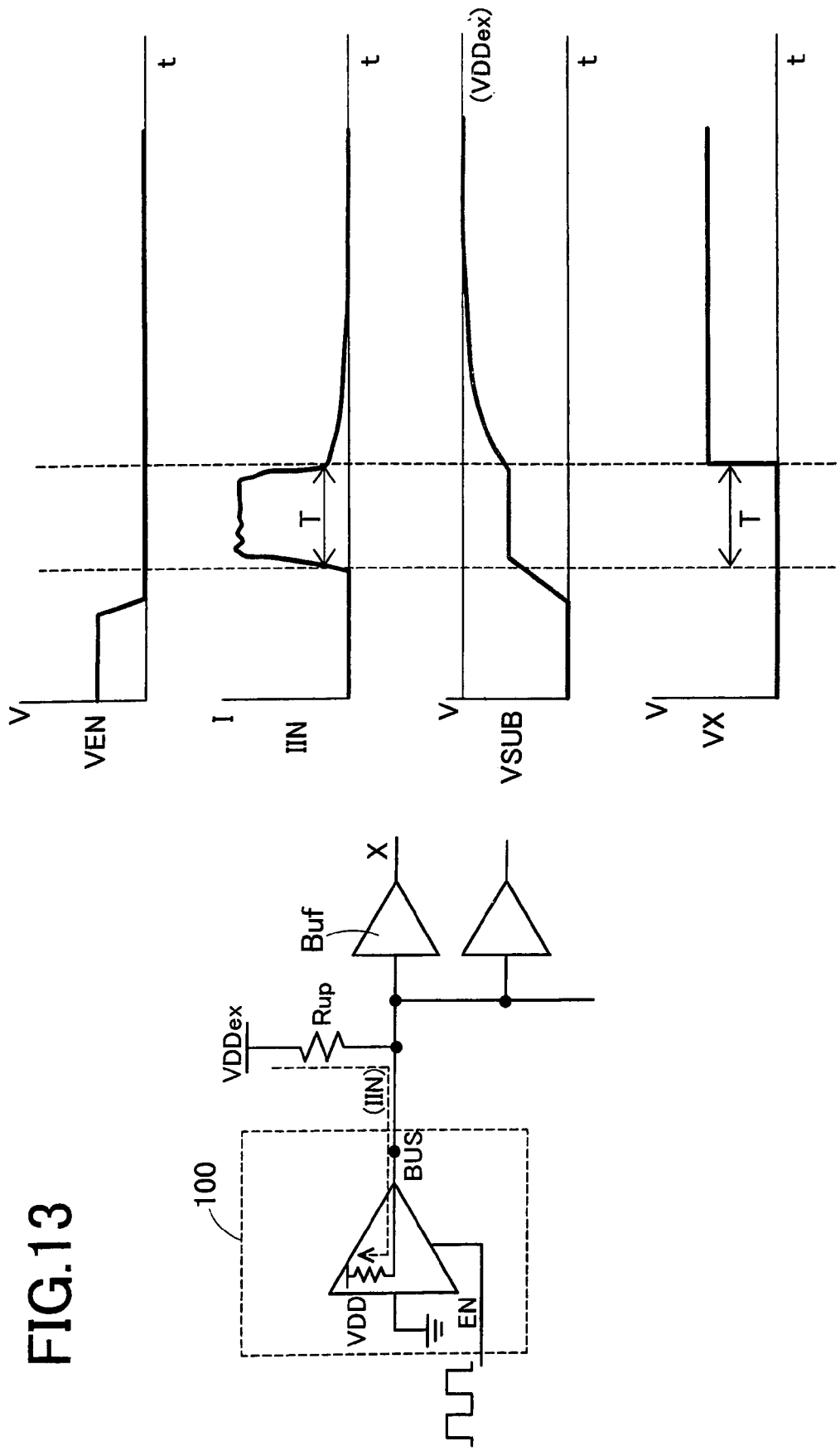
FIG.13 -- PRIOR ART --

SEMICONDUCTOR DEVICE

CROSS-REFERENCE TO RELATED APPLICATIONS

This application is a continuation application based upon and claims the benefit of the prior PCT International Patent Application No. PCT/JP2003/006714 filed on May 28, 2003, the entire contents of which are incorporated herein by reference.

BACKGROUND OF THE INVENTION

1. Field of the Invention

The present invention relates to a semiconductor device including an output buffer circuit or an input/output buffer circuit, and more specifically, a semiconductor device in which a voltage that is higher than its own power supply voltage may be applied to the output terminal or the input/output terminal.

2. Description of Related Art

Recently, focusing on a semiconductor integrated circuit (hereinafter, referred to as LSI) having a CMOS construction, the drive power supply voltage of the LSI has become low due to miniaturization development. However, the transition to the lower voltage differs among LSIs product fields, so that when constructing a system, a plurality of LSI with different power supply voltages must be combined. Therefore, if possible, direct connection of terminals of LSIs that operate with power supply voltages different from each other is convenient. In this case, it must also be considered that a signal with a voltage amplitude different from the voltage amplitude of an output signal is applied to the terminal. Therefore, it is necessary that an undesirable leak current does not flow between the power supply voltages even when a signal with a voltage amplitude equal to or higher than that of the power supply voltages is applied from the exterior, and circuit systems have been conventionally proposed.

As a prior art, in the driver circuit disclosed in Japanese Published Unexamined Patent Application No. S64(1989)-72618, a circuit example in which no leak current flows even when a voltage higher than the power supply voltage VDD is applied from the exterior is proposed.

As shown in FIG. 11, in the driver circuit 100, to the NAND gate 11 and the NOR gate 12, an output data signal DOUT is inputted, and an output enable signal EN is inputted directly to the NAND gate 11 and inputted to the NOR gate 12 by being inverted through the inverter gate 160. The output terminals thereof are connected to the gate terminal G1 of the PMOS transistor P1 on the power supply voltage VDD side and the gate terminal of the NMOS transistor N1 having a source terminal connected to a ground voltage.

To the source terminal of the PMOS transistor P1, the power supply voltage VDD is inputted via the PMOS transistor P2, and the drain terminal of the NMOS transistor N1 is connected to the drain terminal of the PMOS transistor P1 via the NMOS transistor N2 having a gate terminal connected to a power supply voltage source VDD. This connection point is a terminal BUS.

In addition, the gate terminal G2 of the PMOS transistor P2 is connected to the NMOS transistor N6 via the NMOS transistor N4. The source terminal of the NMOS transistor N6 is connected to a ground voltage, and to the gate terminal, an output enable signal EN is inputted. To the gate terminal of the NMOS transistor N4, the power supply voltage VDD is inputted.

Furthermore, between the gate terminal G2 and the drain terminal of the PMOS transistor P2, a PMOS transistor P100 having a gate terminal to which the output enable signal EN is inputted is connected. Although illustration is omitted, it is also allowed that the gate terminal of the PMOS transistor P100 is connected to a power supply voltage VDD. The N well NW of the PMOS transistors P1, P2, and P100 is connected to the N well voltage control circuit 130 constructed of a PMOS transistor.

In the driver circuit 100, even when a voltage equal to or higher than a threshold voltage of the PMOS transistor is applied from the power voltage VDD to the terminal BUS, the PMOS transistor P2 maintains a nonconductive state and prevents a leak current from flowing to the power supply voltage VDD through the PMOS transistors P1 and P2 from the terminal BUS.

The prior art document referred to in the description given above is as follows.

However, this has a first problem shown in FIG. 12. In a case where an input/output buffer circuit 110 to which an input signal with a voltage higher than its own power supply voltage VDD may be inputted through the terminal BUS is constructed by adding an input buffer circuit 400 to the drive circuit 100, when the operation mode switches from an output buffer mode to an input buffer mode, and the input signal with a voltage higher than the power supply voltage VDD is inputted, a problem may occur.

As the output enable signal EN being at the high level in the output buffer mode goes low, the input buffer mode is started. When the output enable signal EN goes low, the NMOS transistor N6 becomes nonconductive. As a result, the transistor that drives the gate terminal G2 of the PMOS transistor P2 disappears, and the terminal G2 floats. In this case, since the level of the gate terminal voltage VG2 immediately before this event is low, the terminal G2 maintains the low voltage level even after switching to the input buffer mode. The gate terminal voltage of the PMOS transistor P100 becomes the ground voltage, and the gate terminal voltage VG1 of the PMOS transistor P1 becomes the power supply voltage VDD. In some cases, the gate terminal of the PMOS transistor P100 is connected to a power supply voltage VDD.

In this state, when, from the terminal BUS, a voltage signal VDDex higher than the threshold voltages of the PMOS transistors is inputted from the power supply voltage VDD, the PMOS transistor P1 conducts it. Herein, when the gate terminal of the PMOS transistor P100 is at the ground voltage, the PMOS transistor P100 maintains the conductive state, and even when the gate terminal of the PMOS transistor P100 is connected to a power supply voltage VDD, the PMOS transistor P100 is conductive, so that the voltage level VG2 of the terminal G2 is charged to the voltage level to be externally inputted, however, rapid charging is not carried out due to a time constant caused by parasitic resistances and parasitic capacitances of the transistors and wiring.

Therefore, in some cases, in the charging transition period (T) of the voltage level VG2 of the terminal G2, the PMOS transistor P2 is maintained as conductive. In this case, a leak current IIN from the terminal BUS to the power supply voltage VDD is generated. This leak current IIN flows-in from the high voltage level VDDex connected to the interface circuit IF connected to the terminal BUS, the voltage is divided into an output resistance of the interface circuit IF and ON-resistances of the PMOS transistors P1 and P2, and the voltage level VBUS of the bus line BUS drops. When the dropped voltage becomes lower than the input threshold voltage of the buffer circuit Buf, the output voltage VX may not be outputted and is a problem.

A second problem is shown in FIG. 13. A voltage VDDex higher than the power supply voltage VDD is generated as an output voltage, and this may pose a problem when the output structure of the driver circuit 100 is tentatively used as an open drain structure of the NMOS transistor.

In the driver circuit 100, the ground voltage is supplied to a terminal to which the output data signal DOUT should be inputted and the output data signal DOUT is inputted to a terminal to which the output enable signal EN should be inputted.

In response to the output data signal DOUT at a high level, the driver circuit 100 becomes able to output, and outputs a low level signal fixed to the ground voltage. At this point, the PMOS transistor P1 maintains the conductive state, so that the voltage level VG2 of the gate terminal G2 is the ground voltage.

When the output data signal DOUT goes low, the driver circuit 100 becomes unable to output, and the PMOS transistor P1 and the NMOS transistor N1 both become nonconductive. Simultaneously, the NMOS transistor N6 also becomes nonconductive, and the terminal G2 floats while maintaining the low voltage level.

The bus line BUS that is not driven from the driver circuit 100 is charged to the external voltage VDDex by an external pull-up resistor Rup, however, this charging is not rapid due to parasitic resistances and parasitic capacitances.

When the voltage VBUS to be applied to the terminal BUS from the power voltage VDD becomes higher than the threshold voltage of the PMOS transistor, the PMOS transistor P1 becomes conductive and the terminal G2 is charged, however, since this charging is not rapid, during the charging transition period (T) of the voltage level VG2, the PMOS transistor P2 may be maintained as conductive. In this case, a leak current IIN from the terminal BUS to the power supply voltage VDD is generated. When a voltage drop of the bus line BUS due to this leak current IIN becomes lower than the input threshold voltage of the buffer circuit Buf, the output voltage VX may not be outputted and this is a problem.

The invention was made to solve at least one of the above-described conventional problems, and an object thereof is to provide a semiconductor device including an output buffer circuit or an input/output buffer circuit which can correctly maintain the terminal voltage without an undesirable leak current flow via terminals even when a voltage signal higher than its own power supply voltage is applied to the output terminal or the input/output terminal.

SUMMARY OF THE INVENTION

In order to achieve the above-mentioned object, a semiconductor device according to a first aspect of the invention comprises a first PMOS transistor and a second PMOS transistor which are connected in series between a power supply voltage source and an output terminal or an input/output terminal in a case where a voltage signal higher than its own power supply voltage is applied to the output terminal or the input/output terminal, wherein the gate terminal of the first PMOS transistor is maintained at the power supply voltage in a non-outputting state, and is driven according to an output signal in an outputting state. When an applying voltage applied to the output terminal or the input/output terminal in the non-outputting state is in a first region equal to or more than a voltage of the power supply voltage plus a predetermined voltage, the gate terminal of the second PMOS transistor is set to the applying voltage, and when the applying voltage is in a second region less than the voltage of the power supply voltage plus the predetermined voltage, the gate terminal is set to the power supply voltage.

In the semiconductor device according to a first aspect, in an outputting state, the first PMOS transistor is drive-controlled, and an output signal is outputted to the output terminal or the input/output terminal. In a non-outputting state, when the applying voltage is in the second region, the power supply voltage is supplied to the gate terminals of the first and second PMOS transistors and a non-conductive state is maintained, and when the applying voltage is in the first region, the applying voltage is supplied to the gate terminal of the second PMOS transistor and a nonconductive state is maintained.

Herein, the voltage of the power supply voltage plus a predetermined voltage is an applying voltage when the second PMOS transistor starts conducting from the output terminal or the input/output terminal to the power supply voltage source when the gate terminal is set to the power supply voltage.

In addition, the predetermined voltage corresponds to the threshold voltage of the second PMOS transistor at which the second PMOS transistor starts conducting from the output terminal or the input/output terminal to the power supply voltage source when the gate terminal is set to the power supply voltage.

Thereby, in the non-outputting state, the gate terminal of the second PMOS transistor does not float and is set to at least the power supply voltage. When the outputting state changes to the non-outputting state and the applying voltage applied to the output terminal or the input/output terminal is equal to or higher than the voltage of the power supply voltage plus the predetermined voltage, the gate terminal of the second PMOS transistor is set from the power supply voltage to the applying voltage, and this period is short, so that an undesirable leak current due to conduction of the second PMOS transistor does not flow from the output terminal or the input/output terminal to the power supply voltage source. Thereby, an undesirable leak current is prevented from flowing to the terminals. In addition, since no undesirable leak current flows, the output terminal or the input/output terminal can be set to a predetermined voltage level.

BRIEF DESCRIPTION OF THE DRAWINGS

FIG. 13 is an explanatory view showing the second problem in the prior art.

DETAILED DESCRIPTION OF THE PREFERRED EMBODIMENTS

Hereinafter, embodiments of the semiconductor device of the invention are described in detail with reference to the drawings of FIG. 1 through FIG. 10.

Figure 1:
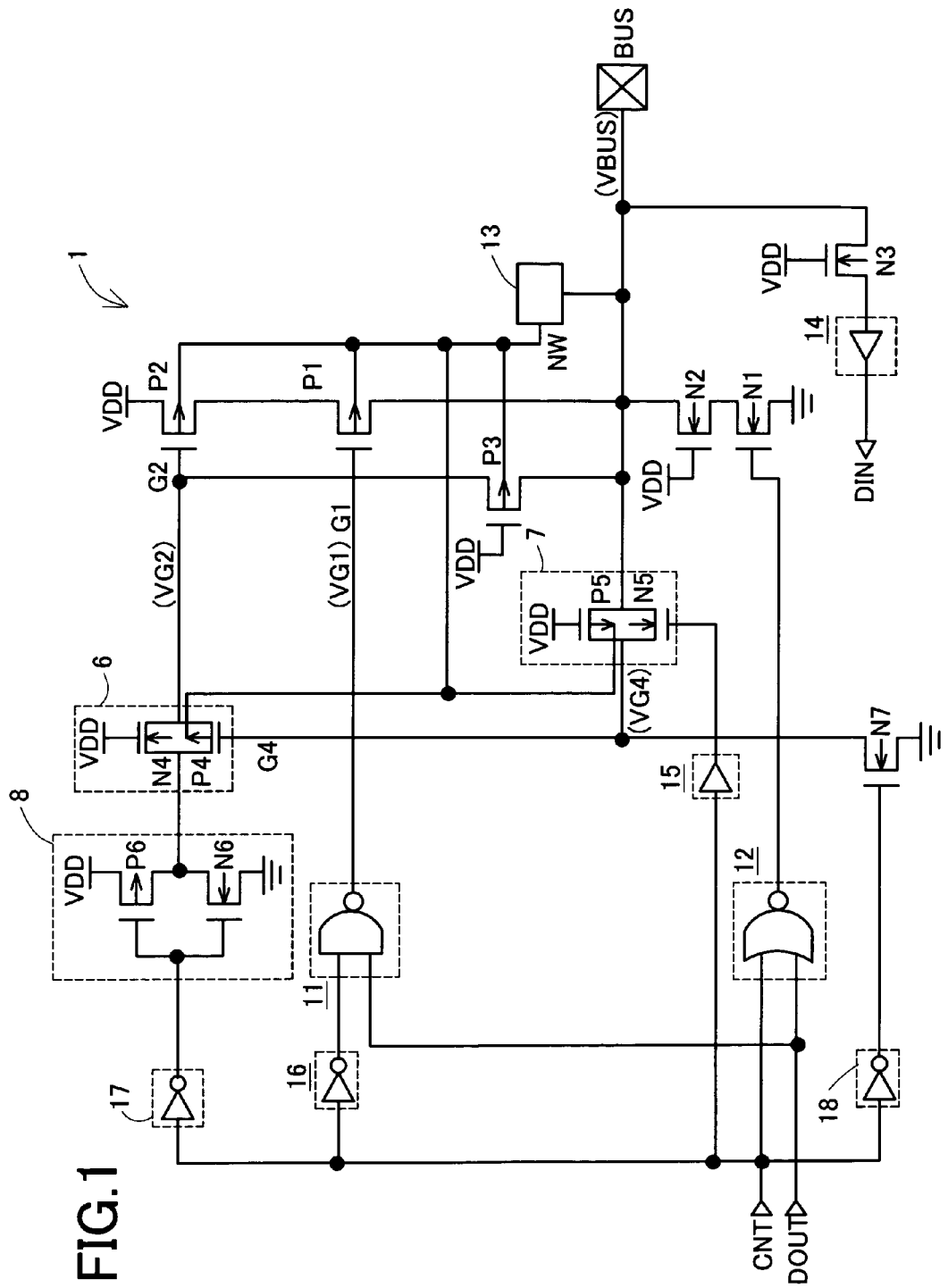
FIG. 1 is a circuit diagram relating to a semiconductor device of a first embodiment.

In the input/output buffer circuit 1 in the semiconductor device of the first embodiment shown in FIG. 1, in addition to the output buffer part, an input buffer circuit 14 and an NMOS transistor N3 having a gate terminal connected to a power supply voltage source VDD for protection of voltage withstand thereof are provided.

In place of the PMOS transistor P100 and the N well voltage control circuit 130 of the conventional input/output buffer circuit 100, a PMOS transistor P3 and an N well voltage control circuit 13 are provided. The PMOS transistor P3 has a source terminal and a drain terminal connected, respectively, to the gate terminal G2 of a PMOS transistor P2 that functions as a second PMOS transistor and an input/output terminal BUS, and has a gate terminal connected to a power supply voltage source VDD. Instead of the output enable signal EN, an input/output mode switching signal CNT the low level of which shows an outputting state is inputted. The input/output mode switching signal CNT shows an outputting state according to an inverted logic of the output enable signal EN, so that inverter gates 16 and 17 are provided to match the logic levels, instead of the inverter gate 160.

Furthermore, the gate drive part 8 is formed by providing a PMOS transistor P6 that connects a power supply voltage VDD and the NMOS transistor N6 in addition to the NMOS transistor N6 in the input/output buffer circuit 100. The gate terminal of the PMOS and NMOS transistors P6 and N6 is connected to the output terminal of the inverter gate 17 to which the input/output mode switching signal CNT is inputted.

The output terminal of the gate drive part 8 is connected to the gate terminal G2 of the PMOS transistor P2 via the first transmission gate 6 including a PMOS transistor P4 having source and drain terminals connected to each other between the same and the NMOS transistor N4 in the input/output buffer circuit 100. Herein, the PMOS transistor P4 functions as the third PMOS transistor, and the first transmission gate 6 functions as the first gate voltage control part.

The gate terminal of the PMOS transistor P4 is connected to the input/output terminal BUS via the second transmission gate 7 including the PMOS and NMOS transistors P5 and N5 having source and drain terminals connected to each other. Furthermore, the gate terminal is connected to a ground voltage via the NMOS transistor N7 that has a gate terminal connected to the inverter gate 18. Herein, the PMOS transistor P5 functions as the fourth PMOS transistor, and the NMOS transistor N5 functions as the first NMOS transistor. In addition, the second transmission gate 7 functions as the second gate voltage control part.

The gate terminal of the PMOS transistor P5 is connected to a power supply voltage source VDD, and the gate terminal of the NMOS transistor N5 is connected to the buffer circuit 15. To the buffer circuit 15, the input/output mode switching signal CNT is inputted. To the inverter gate 18, the input/output mode switching signal CNT is inputted.

The N well voltage control circuit 13 is a circuit for biasing the potential of the N well NW of the PMOS transistors P1 through P5 without discontinuity between the power supply voltage VDD and the applying voltage VBUS according to an applying voltage applied to the input/output terminal BUS although this is described in detail later. Regardless of the voltage level of the applying voltage VBUS, the potential of the N well NW can be set without fail, and the N well NW does not float.

The input/output buffer circuit 1 turns into an outputting state when the voltage level of the input/output mode switching signal CNT is low. The low level signal outputted from the gate drive part 8 through the inverter gate 17 is conducted through both PMOS and NMOS transistors P4 and N4 forming the first transmission gate 6, and the gate terminal G2 of the PMOS transistor P2 is supplied with the low level (VG2=Lo). Thereby, the PMOS transistor P2 maintains its conductive state.

Herein, the low level input/output mode switching signal CNT is inputted as a logic-inverted high level signal to an input terminal of the NAND gate 11 and inputted as a low level signal without change to an input terminal of the NOR gate 12. Therefore, the NAND gate 11 and the NOR gate 12 in this case function as logic inverter gates. Therefore, the output data signal DOUT to be inputted to the input/output buffer circuit is logic-inverted through the NAND gate 11 and the NOR gate 12, and then drives the PMOS transistor P1 and the NMOS transistor N1, and the data is outputted to the input/output terminal BUS through the PMOS transistor P2 and the NMOS transistor N2 that are in a conductive state.

In addition, conduction of the PMOS transistor P4 forming the first transmission gate 6 is as follows. Since the second transmission gate 7 is made nonconductive by the PMOS transistor P5 applied with the power supply voltage VDD on the gate terminal and the NMOS transistor N5 with a gate terminal applied with a low level signal with the same phase as that of the input/output mode switching signal through the buffer circuit 15, the line from the input/output terminal BUS to the gate terminal G4 is blocked. On the other hand, the input/output mode switching signal CNT at the low level is inverted and supplied to the gate terminal, whereby the NMOS transistor N7 becomes conductive, so that the ground voltage is supplied. Therefore, the PMOS transistor P4 becomes conductive.

The input/output buffer circuit 1 turns into a non-outputting state when the voltage level of the input/output mode switching signal CNT is high, and caries out an input buffer operation to accept the input data signal DIN by receiving an input signal from the input/output terminal BUS via the input buffer circuit 14.

In the non-outputting state, the high level input/output mode switching signal CNT is inputted as a logic-inverted low level signal to an input terminal of the NAND gate 11 and inputted as a high level signal without change to an input terminal of the NOR gate 12, whereby the NAND gate 11 and the NOR gate 12 both become nonactive. Namely, from the NAND gate 11, a high level signal is outputted, and from the NOR gate 12, a low level signal is outputted. By fixing the gate terminal G1 of the PMOS transistor P1 to the power supply voltage VDD and fixing the gate terminal of the NMOS transistor N1 to the ground voltage, the function as an output buffer becomes nonactive.

Although the high level signal of the power supply voltage VDD is outputted from the gate drive part 8 through the inverter gate 17, by controlling the first transmission gate 6 according to the applying voltage VBUS inputted to the input/output terminal BUS, an undesirable leak current can be prevented from flowing between the input/output terminal BUS and the power supply voltage VDD even when an applying voltage VBUS higher than the power supply voltage VDD is inputted. Control of the first transmission gate 6 is conduction control of the PMOS transistor P4. The NMOS transistor N7 becomes nonconductive due to the high level input/output mode switching signal CNT, and the voltage level VG4 of the gate terminal G4 is controlled by the second transmission gate 7 to control conduction of the PMOS transistor P4.

In the second transmission gate, to the gate terminal of the NMOS transistor N5, the power supply voltage VDD or a voltage level dropped as described later is applied through the buffer circuit 15. The NMOS transistor N5 operates with nonsaturation or saturation characteristics according to the voltage level of the applying voltage VBUS inputted into the input/output terminal BUS, and has characteristics for applying the applying voltage VBUS or a voltage obtained by subtracting the threshold voltage Vthn of the NMOS transistor from the power supply voltage VDD or the dropped voltage to the gate terminal G4.

The gate terminal of the PMOS transistor P5 is fixed to the power supply voltage VDD. Therefore, the transistor has characteristics in that it becomes conductive when the applying voltage VBUS is equal to or higher than the voltage of the power supply voltage VDD plus the threshold voltage Vthp of the PMOS transistor, and applies the gate terminal G4 with the applying voltage VBUS.

Figure 5:
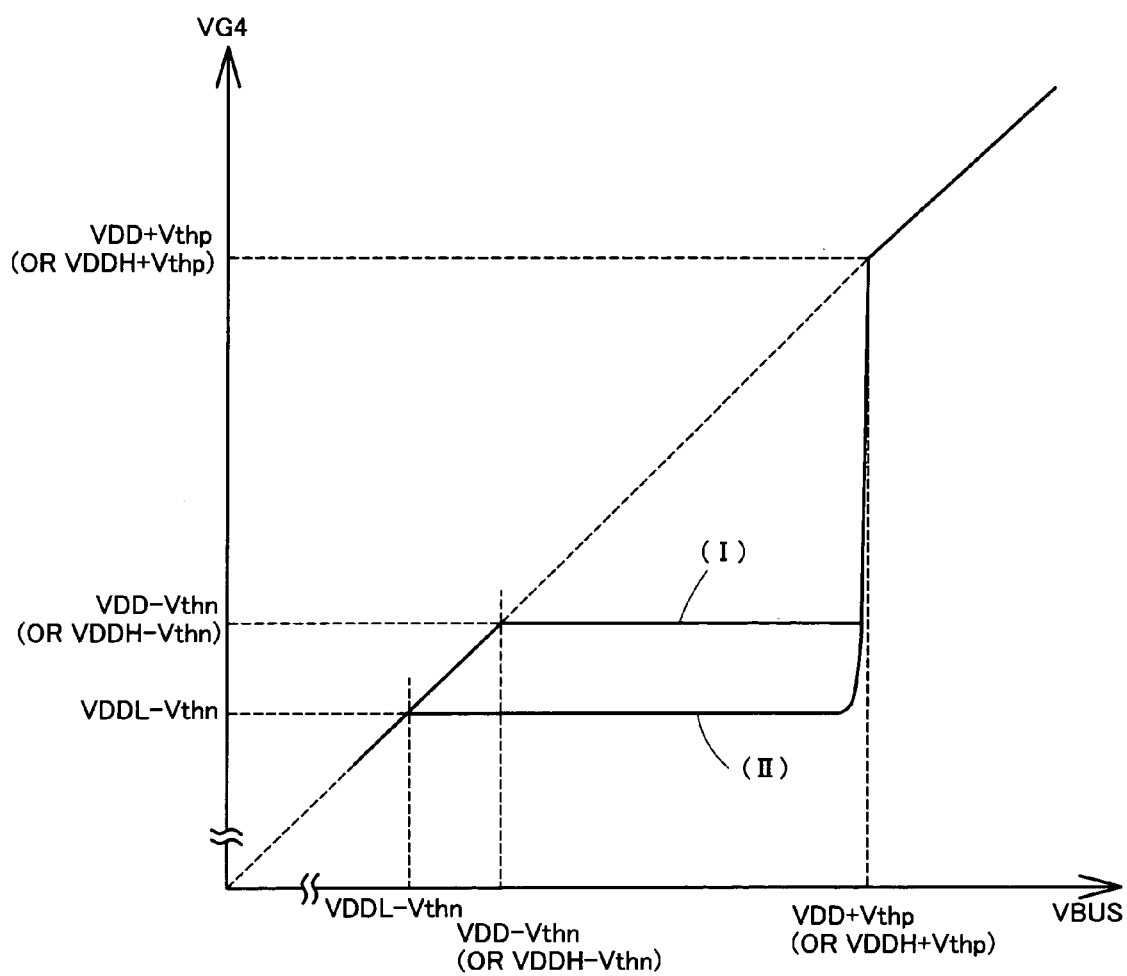
FIG. 5 is a characteristic diagram showing gate terminal voltage (VG4) characteristics of the PMOS transistor P4 in the embodiment.

Herein, the characteristics of the gate terminal voltage VG4 with respect to the applying voltage VBUS are described in detail based on FIG. 5. Herein, an example in which the power supply voltage VDD is applied to the gate terminal of the NMOS transistor N5 is described (shown by (I) of FIG. 5). Description is given below while disregarding the voltage drop due to ON-resistances and wiring resistances of the PMOS and NMOS transistors.

When the applying voltage VBUS is less than the voltage obtained by subtracting the threshold voltage Vthn from the power supply voltage VDD ($0 \leq VBUS < VDD-Vthn$), the NMOS transistor N5 conducts in the nonsaturation region, and the gate terminal voltage VG4 becomes the applying voltage VBUS (VG4=VBUS). Herein, on condition that both threshold voltages of the NMOS and PMOS are almost equal to each other, the PMOS transistor P4 is biased to be equal to or more than the threshold voltage Vthp, and the power supply voltage VDD outputted from the gate drive part 8 in a non-outputting state is supplied to the gate terminal G2 (VG2=VDD). Therefore, VG2>VBUS, the PMOS transistor P2 is maintained as nonconductive, and no leak current flows between the input/output terminal BUS and the power supply voltage VDD.

When the applying voltage VBUS is equal to or higher than the voltage obtained by subtracting the threshold voltage Vthn from the power supply voltage VDD and less than the voltage obtained by subtracting the threshold voltage Vthp from the power supply voltage VDD ($VDD-Vthn \leq VBUS < VDD-Vthp$), the NMOS transistor N5 conducts it in the saturation region, and the voltage obtained by subtracting the threshold voltage Vthn from the power supply voltage VDD is applied to the gate terminal voltage VG4 (VG4=VDD−Vthn). Herein, on condition that both threshold voltages of NMOS and PMOS are almost equal to each other, the PMOS transistor P4 is biased to be equal to or more than the threshold voltage Vthp, and in an non-outputting state, the high level signal of the power supply voltage VDD is supplied to the gate terminal G2 (VG2=VDD). Therefore, since VG2 becomes higher than VBUS, the PMOS transistor P2 is maintained as nonconductive, and no leak current flows between the input/output terminal BUS and the power supply voltage VDD.

When the input signal voltage VBUS is equal to or higher than the voltage obtained by subtracting the threshold voltage Vthp from the power supply voltage VDD and less than the voltage of the power supply voltage VDD plus the threshold voltage Vthp ($VDD-Vthp \leq VBUS < VDD+Vthp$), the NMOS transistor N5 is also conductive in the saturation region, and the voltage obtained by subtracting the threshold voltage Vthn from the power supply voltage VDD is applied to the gate terminal voltage VG4 (VG4=VDD−Vthn). Herein, on condition that both threshold voltages of NMOS and PMOS are almost equal to each other, the PMOS transistor P4 is biased to be equal to or more than the threshold voltage Vthp, and the power supply voltage VDD is supplied to the gate terminal G2 (VG2=VDD). In this case, VG2>VBUS−Vthp, and the PMOS transistor P2 is still maintained as nonconductive since the bias voltage is equal to or less than the threshold voltage Vthp, and no leak current flows between the input/output terminal BUS and the power supply voltage VDD.

When the applying voltage VBUS is equal to or higher than the voltage of the power supply voltage VDD plus the threshold voltage Vthp ($VDD+Vthp \leq VBUS$), the PMOS transistor P5 conducts in the nonsaturation region, and the applying voltage VBUS is supplied to the gate terminal voltage VG4 (VG4=VBUS). Therefore, the PMOS transistor P4 becomes nonconductive. However, in this state, the PMOS transistor P3 conducts the voltage, so that the gate terminal voltage VG2 is applied to the applying voltage VBUS (VG2=VBUS). Since VG2 is equal to VBUS, the PMOS transistor P2 is maintained as nonconductive, and no leak current flows between the input/output terminal BUS and the power supply voltage VDD.

Since the gate terminal of the NMOS transistor N4 is at the power supply voltage VDD, the applying voltage VBUS is not applied to the gate drive part 8 from the gate terminal G2. No over voltage is applied to the gate drive part 8. Furthermore, to the gate drive part 8, the PMOS transistor P6 electrically continues and the power supply voltage VDD is outputted. The NMOS transistor N4 does not become conductive, so that no undesirable leak current flows from the gate terminal G2 to the gate drive part 8.

Figure 6:
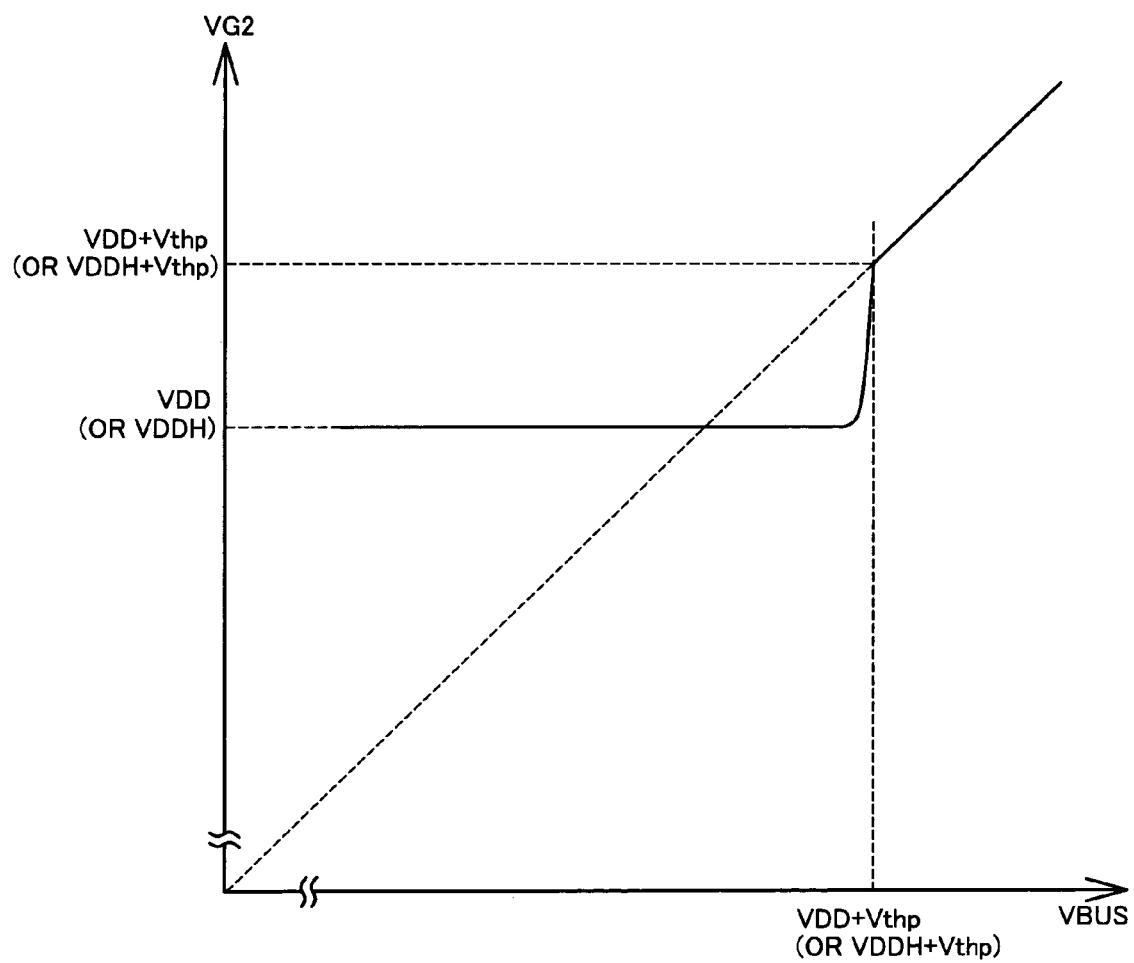
FIG. 6 is a characteristic diagram showing gate terminal voltage (VG2) characteristics of the PMOS transistor P2 in the embodiment.

The characteristics of the gate terminal voltage VG2 of the PMOS transistor P2 are shown in FIG. 6. When the applying voltage VBUS is less than the voltage of the power supply voltage VDD plus the threshold voltage Vthp, the power supply voltage is supplied, and when the applying voltage VBUS is equal to or higher than the voltage of the power supply voltage VDD plus the threshold voltage Vthp, the applying voltage VBUS is supplied. Regardless of the voltage level of the applying voltage VBUS, the PMOS transistor P2 does not conduct voltage, so that no leak current flows between the input/output terminal BUS and the power supply voltage VDD.

Herein, it is described that the voltage to be applied to the gate terminal of the NMOS transistor N5 is the power supply voltage VDD, however, if the buffer circuit 15 has the voltage dropping function described later, the dropped voltage VDDL is supplied to the gate terminal. The voltage VG4 to be supplied to the gate terminal G4 due to the saturation characteristics of the NMOS transistor N5 becomes VDDL-Vthn shown by (II) of FIG. 5, and the PMOS transistor P4 is biased to a conductive state more securely.

Next, detailed examples of the N well voltage control circuit 13 are described with reference to FIG. 2 through FIG. 4.

Figure 2:
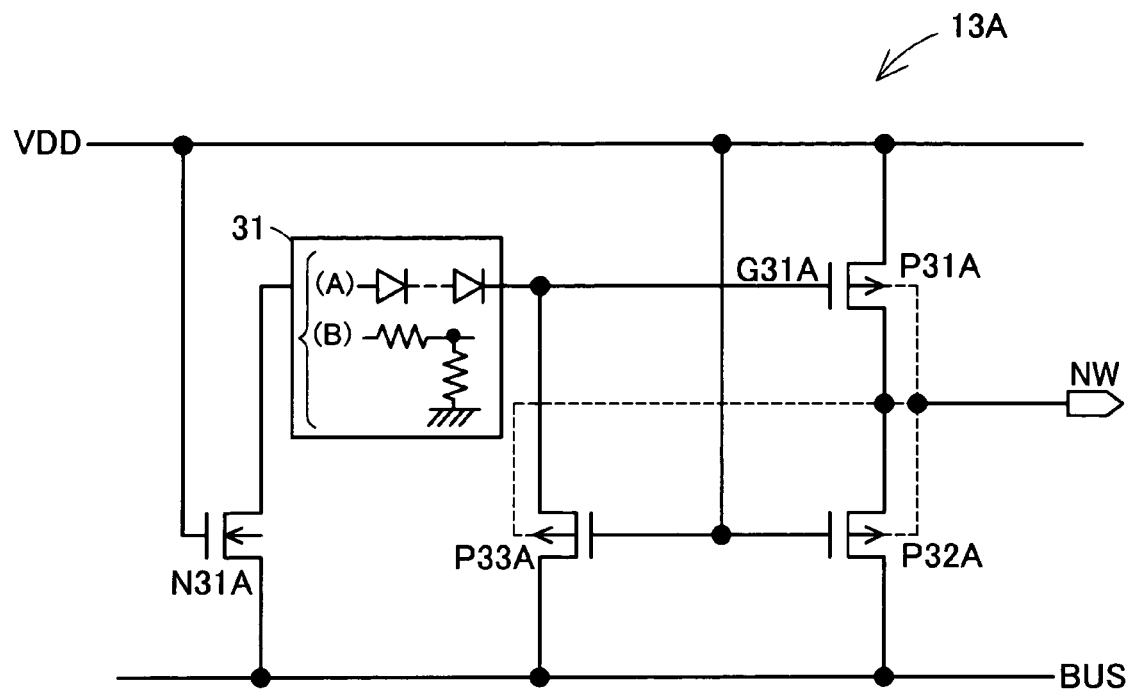
FIG. 2 is a circuit diagram showing a first detailed example of an N well voltage control circuit.

The N well voltage control circuit 13A of the first detailed example shown in FIG. 2 is provided with a PMOS transistor P31A that has a source terminal connected to a power supply voltage VDD and a drain terminal and a back gate terminal connected to the N well NW, and a PMOS transistor P32A that has a source terminal connected to the input/output terminal BUS, a drain terminal and a back gate terminal connected to the N well NW, and a gate terminal connected to the power supply voltage VDD.

Conduction and non-conduction of the PMOS transistor P31A are controlled by a PMOS transistor control part connected to the gate terminal G31A.

The PMOS transistor control part is provided with an NMOS transistor N31A, a PMOS transistor P33A, and a first voltage dropping part 31 as appropriate. The NMOS transistor N31A has a drain terminal connected to the input/output terminal BUS, a source terminal connected to the gate terminal G31A of the PMOS transistor P31A via the first voltage dropping part 31, and a gate terminal connected to the power supply voltage VDD. The PMOS transistor P33A has a source terminal connected to the input/output terminal BUS, a drain terminal connected to the gate terminal G31A of the PMOS transistor P31A, a back gate terminal connected to the N well NW, and a gate terminal connected to the power supply voltage VDD.

The first voltage dropping part 31 drops a voltage from the source terminal of the NMOS transistor N31A and supplies it to the gate terminal G31A of the PMOS transistor P31A.

FIG. 2 also shows a detailed example of the first voltage dropping part 31. The detailed example (A) drops the voltage by serial connection of a predetermined number of diodes. By properly setting the predetermined number of diodes, when the PMOS transistor P31A is made conductive, a voltage equal to or lower than the voltage obtained by subtracting the threshold voltage Vthp from the power supply voltage VDD is supplied to the gate terminal G31A of the PMOS transistor P31A. The detailed example (B) divides the voltage of the source terminal of the NMOS transistor N31A by resistor elements. By properly setting the voltage division ratio, a voltage equal to or less than the voltage obtained by subtracting the threshold voltage Vthp from the power supply voltage VDD is supplied to the gate terminal G31A of the PMOS transistor P31A.

Figure 3:
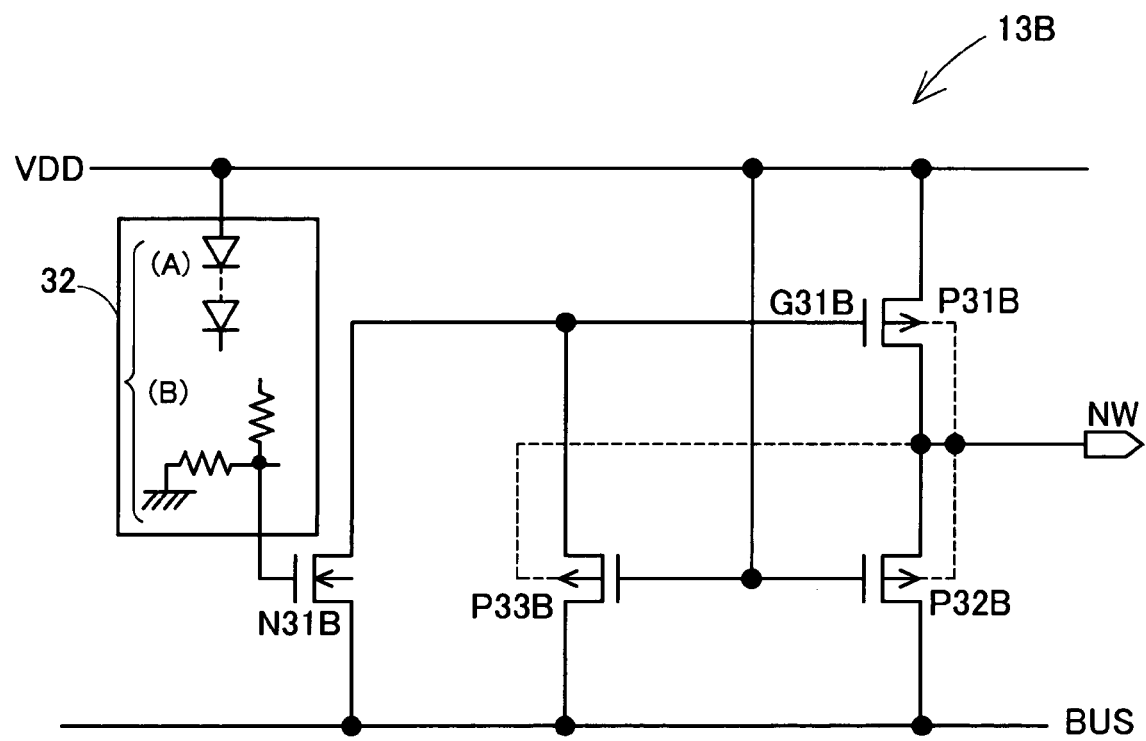
FIG. 3 is a circuit diagram showing a second detailed example of an N well voltage control circuit.

The N well voltage control circuit 13B as a second detailed example shown in FIG. 3 is provided with a second voltage dropping part 32 in place of the first voltage dropping part 31 of the N well voltage control circuit 13A (FIG. 2) of the first detailed example in the PMOS transistor control part.

In the PMOS transistor control part, the NMOS transistor N31B has a source terminal directly connected to the gate terminal G31B of the PMOS transistor P31B and a gate terminal connected to the power supply voltage VDD via the second voltage dropping part 32.

The second voltage dropping part 32 biases the gate terminal of the NMOS transistor N31B by dropping the power supply voltage VDD. Thereby, the properly dropped voltage is outputted to the source terminal of the NMOS transistor N31B and can be supplied to the gate terminal G31B.

The detailed example of the second voltage dropping part 32 shown in FIG. 3 is similar to the detailed example of the first voltage dropping part 31 (FIG. 2). By serial connection of a predetermined number of diodes (detailed example (A)), and by dividing the power supply voltage VDD by resistor elements (detailed example (B)), a dropped voltage can be obtained.

In the N well voltage control circuits 13A and 13B of the first and second detailed examples, when the applying voltage VBUS is equal to or higher than the voltage of the power supply voltage VDD plus the threshold voltage Vthp (VBUS≧VDD+Vthp), the PMOS transistors P33A and P33B conducts the voltage and the gate terminals G31A and G31B are biased to the voltage VBUS, and the PMOS transistors P31A and P31B become nonconductive. On the other hand, the PMOS transistors P32A and P32B conduct and the potential of the N well NW becomes the applying voltage VBUS.

When the applying voltage VBUS drops to be less than the voltage of the power supply voltage VDD plus the threshold voltage Vthp (VBUS<VDD+Vthp), the PMOS transistors P32A, P33A, P32B, and P33B become nonconductive. On the other hand, the NMOS transistors N31A and N31B become conductive.

Until the applying voltage VBUS drops to the voltage obtained by subtracting the threshold voltage Vthn from the voltage of the gate terminals of the NMOS transistors N31A and N31B, the NMOS transistors N31A and N31B saturation-operates, so that the voltage of the source terminals is roughly fixed to the voltage obtained by subtracting the threshold voltage Vthn from the voltage of the gate terminals. If the applying voltage drops lower than this, the NMOS transistors N31A and N31B linearly operate and conduct the voltage, and the applying voltage VBUS is outputted without change to the source terminals of the NMOS transistors N31A and N31B.

Herein, the voltage to be supplied to the gate terminals of the NMOS transistors N31A and N31B is the power supply voltage VDD (FIG. 2) or a voltage (FIG. 3) dropped from the power supply voltage VDD. This voltage is directly supplied (FIG. 3) or dropped and supplied (FIG. 2) to the gate terminals G31A and G31B of the PMOS transistors P31A and P31B. When the first and second voltage dropping parts 31 and 32 are not provided, the applying voltage VBUS is set on condition that it becomes the voltage obtained by subtracting the threshold voltage Vthn of the NMOS transistors N31A and N31B from the power supply voltage VDD.

When the threshold voltages of the NMOS transistors N31A and N31B and the PMOS transistors P31A and P31B are almost equal to each other, the PMOS transistors P31A ad P31B are applied with voltages so that the potential difference between the gates and sources becomes equal to or more than the threshold voltage Vthp. The power supply voltage VDD is conducted and supplied to the N well NW.

Even when the threshold voltages of the NMOS transistors N31A and N31B and the PMOS transistors P31A and P31B are different from each other, by providing at least either one of the first or second voltage dropping part 31 or 32, it becomes possible that the applying voltage VBUS is sufficiently dropped and conducted through the PMOS transistors P31A and P31B.

Figure 4:
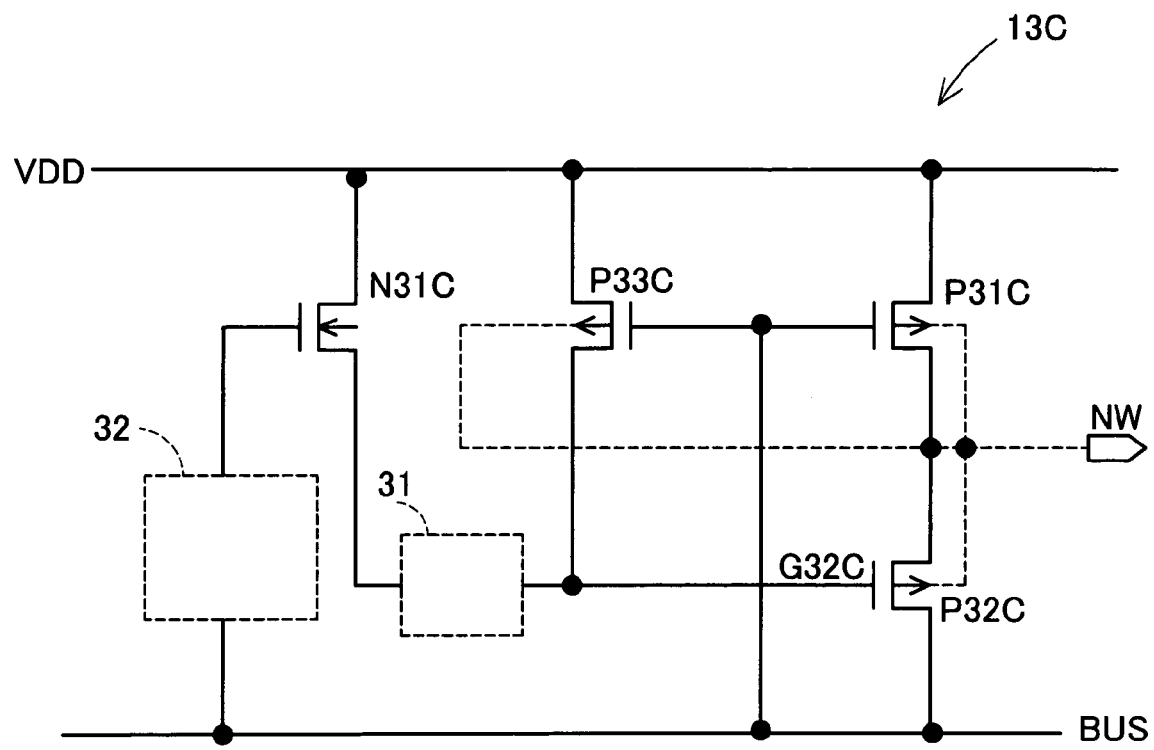
FIG. 4 is a circuit diagram showing a third detailed example of an N well voltage control circuit.

The N well voltage control circuit 13C of the third detailed example shown in FIG. 4 has a structure in which the connections of the N well voltage control circuits 13A and 13B (FIG. 2 and FIG. 3) of the first and second detailed examples in that the PMOS transistor control part controls the PMOS transistors P31A and P31B and the gate terminals of the PMOS transistors P32A and P32B are connected to the power supply voltage VDD are reversed. Namely, the NMOS transistor N31C and the PMOS transistor P33C are provided between the gate terminal G32C of the PMOS transistor P32C and the power supply voltage VDD, and the gate terminal of the NMOS transistor N31C is connected to the input/output terminal BUS. Furthermore, the gate terminals of the PMOS transistors P31C and P33C are connected to the input/output terminal BUS. In this case, the connections of the first voltage dropping part 31 and the second voltage dropping part 32 can be made similar to those of the N well voltage control circuits 13A and 13B of the first and second detailed examples. Namely, the first voltage dropping part 31 can be provided between the NMOS transistor N31C and the gate terminal G32C. The second voltage dropping part 32 can be connected between the gate terminal of the NMOS transistor N31C and the input/output terminal BUS.

In the N well voltage control circuit 13C of the third detailed example, when the first and second voltage dropping parts 31 and 32 are not provided, the NMOS transistor N31C saturation-operates by the applying voltage VBUS less than the voltage of the power supply voltage VDD plus the threshold voltage Vthn. To the gate terminal G32C of the PMOS transistor P32C, a voltage obtained by subtracting the threshold voltage Vthn from the applying voltage VBUS is supplied. On condition that both threshold voltages of the NMOS and PMOS are equal to each other, the PMOS transistor P32C conducts the voltage and sets the N well potential VNW to the applying voltage VBUS.

When the applying voltage VBUS becomes equal to or higher than the voltage of the power supply voltage VDD plus the threshold voltage Vthn, the NMOS transistor N31C linearly operates. To the gate terminal G32C of the PMOS transistor P32C, the power supply voltage VDD is supplied. The applying voltage VBUS is supplied to the N well NW by conduction through the PMOS transistor P32C.

Actions and effects in the case where the first and second voltage dropping parts 31 and 32 are provided are the same as those in the case of the N well voltage control circuits 13A and 13B of the first and second detailed examples, so that description is omitted herein. Herein, according to the effect of the voltage drop by the first voltage dropping part 31, at the applying voltage VBUS equal to or higher than the voltage of the power supply voltage VDD plus the threshold voltage Vthn, the voltage level dropped by the first voltage dropping part 31 from the power supply voltage VDD is set on the gate terminal G32C, and according to the effect of the voltage drop by the second voltage dropping part 32, the gate terminal G32C is set to a voltage level obtained by subtracting the voltage level dropped by the second voltage dropping part 32 and further subtracting the threshold voltage Vthn from the applying voltage VBUS.

Figure 7:
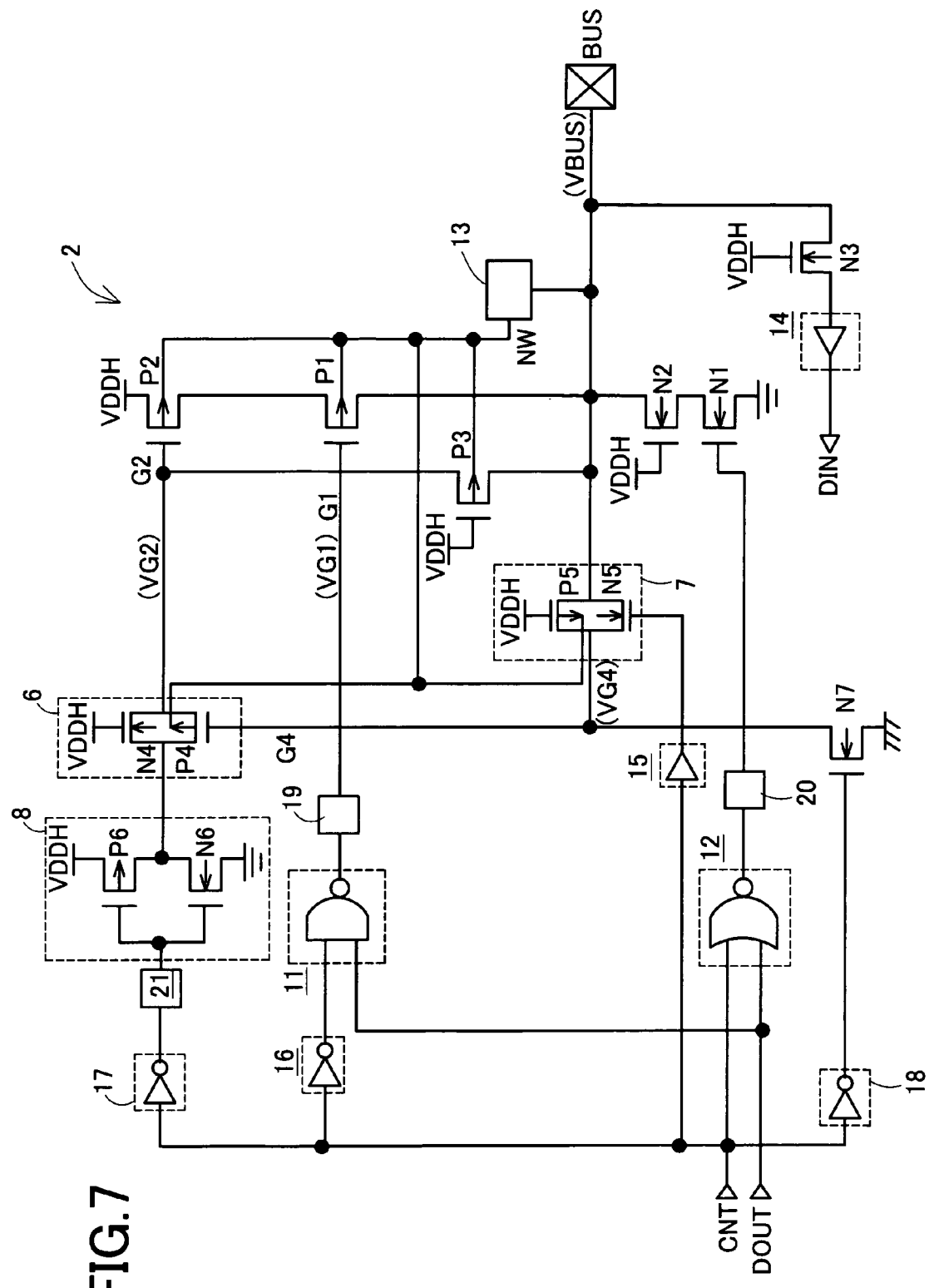
FIG. 7 is a circuit diagram of a semiconductor device according to a second embodiment.

In the input/output buffer circuit 2 of the second embodiment shown in FIG. 7, different from the input/output buffer circuit 1 of the first embodiment, a power supply voltage VDDH with a voltage higher than the power supply voltage VDD used for the internal circuit is used for the output buffer portion for interface with the exterior. Furthermore, as interface between the circuit portion that operates by the power supply voltage VDD and the circuit portion that operates by the high power supply voltage VDDH, level converter circuits 19, 20, and 21 are provided. To the gate terminal of the NMOS transistor N5, the power supply voltage VDD is applied.

In the input/output buffer circuit 2 of the second embodiment, the same actions and effects as those of the input/output buffer circuit 1 of the first embodiment are obtained. The actions and effects obtained by applying the power supply voltage VDD to the gate terminal of the NMOS transistor N5 are the same as those in the case where the buffer circuit 15 has a voltage dropping function in the input/output buffer circuit 1. Namely, the gate terminal voltage VG4 becomes a voltage obtained by further subtracting the threshold voltage Vthn from the power supply voltage VDD dropped to be lower than the high power supply voltage VDDH (VG4=VDD−Vthn), whereby the PMOS transistor P4 can be biased to be conductive, more securely.

Figure 8A:
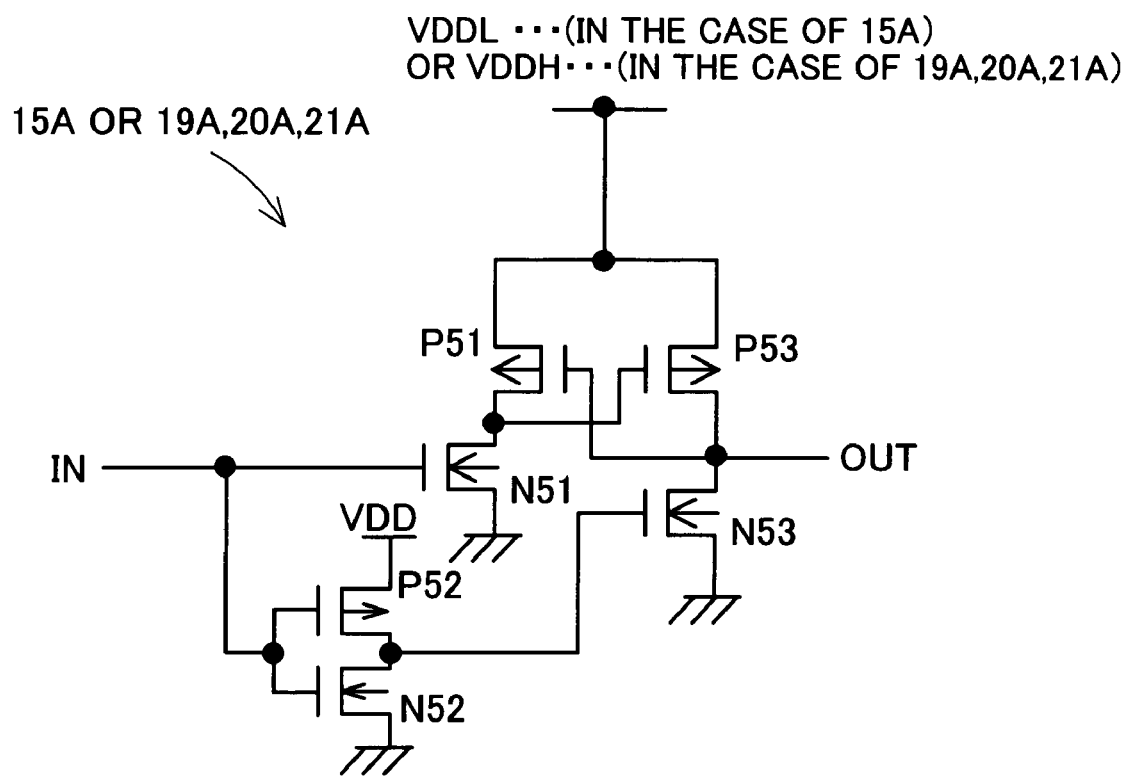
FIG. 8A is a circuit diagram showing one detailed example of level converter circuits.

Herein, in the buffer circuit 15 of the first embodiment, a detailed example 15A in the case where the output voltage is level-shifted to the voltage VDDL dropped from the power supply voltage VDD, and in the level converter circuits 19 through 21 of the second embodiment, detailed examples (19A through 21A) in the case where the output voltage is level-shifted to the high power supply voltage VDDH higher than the power supply voltage VDD, are shown in FIG. 8A.

An input signal IN is inputted to the gate terminals of an inverter gate that includes the PMOS transistor P52 and the NMOS transistor N52 and the NMOS transistor N51. The output terminal of the inverter gate is connected to the gate terminal of the NMOS transistor N53. The NMOS transistors N51 and N53 have source terminals connected to the ground voltage, and drain terminals connected to the drain terminals of the PMOS transistors P51 and P53, respectively. The gate terminals of the PMOS transistors P51 and P53 are connected to the drain terminals of other transistors, and the source terminals thereof are both connected to the dropped voltage VDDL (in the case of 15A), or the high power supply voltage VDDH (in the case of 19A through 21A).

It is assumed that a high-level input signal IN is inputted. The NMOS transistor N51 becomes conductive and the gate terminal voltage of the PMOS transistor P53 is set to the ground voltage, whereby the PMOS transistor P53 becomes conductive. In addition, a low-level signal inverted by the inverter gate is inputted to the gate terminal of the NMOS transistor N53 and the NMOS transistor N53 becomes nonconductive. Therefore, the signal OUT to be outputted becomes the dropped voltage VDDL or the high power supply voltage VDDH through the PMOS transistor P53.

Herein, the signal OUT to be outputted is inputted to the gate terminal of the PMOS transistor P51 and makes the PMOS transistor P51 nonconductive.

It is assumed that a low level signal with the ground voltage is inputted as the input signal IN. In this case, the NMOS transistor N51 becomes nonconductive and the line from the gate terminal of the PMOS transistor P53 to the ground voltage is blocked. On the other hand, since a high level signal inverted by the inverter gate is inputted to the gate terminal of the NMOS transistor N53, the NMOS transistor N53 becomes conductive. Accordingly, the signal OUT to be outputted becomes the ground voltage through the NMOS transistor N53. The signal OUT to be outputted is inputted to the gate terminal of the PMOS transistor P51, the PMOS transistor P51 conducts it and the PMOS transistor P53 is maintained as nonconductive.

Figure 8B:
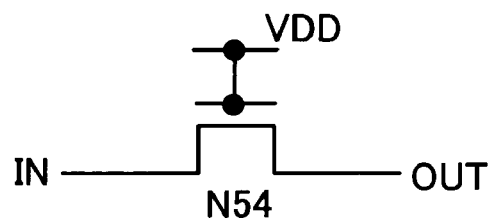
FIG. 8B is a circuit diagram showing another detailed example of level converter circuits.

As shown in FIG. 8B, it is also possible that a voltage dropping circuit is formed by the NMOS transistor N54 which has source and drain terminals that receive and output an input signal IN and an output signal OUT, respectively, and a gate terminal connected to a power supply voltage VDD. In this case, when a high level signal at the power supply voltage VDD level is inputted as the input signal IN, a voltage obtained by subtracting the threshold voltage Vthn from the power supply voltage VDD level is outputted.

Figure 9:
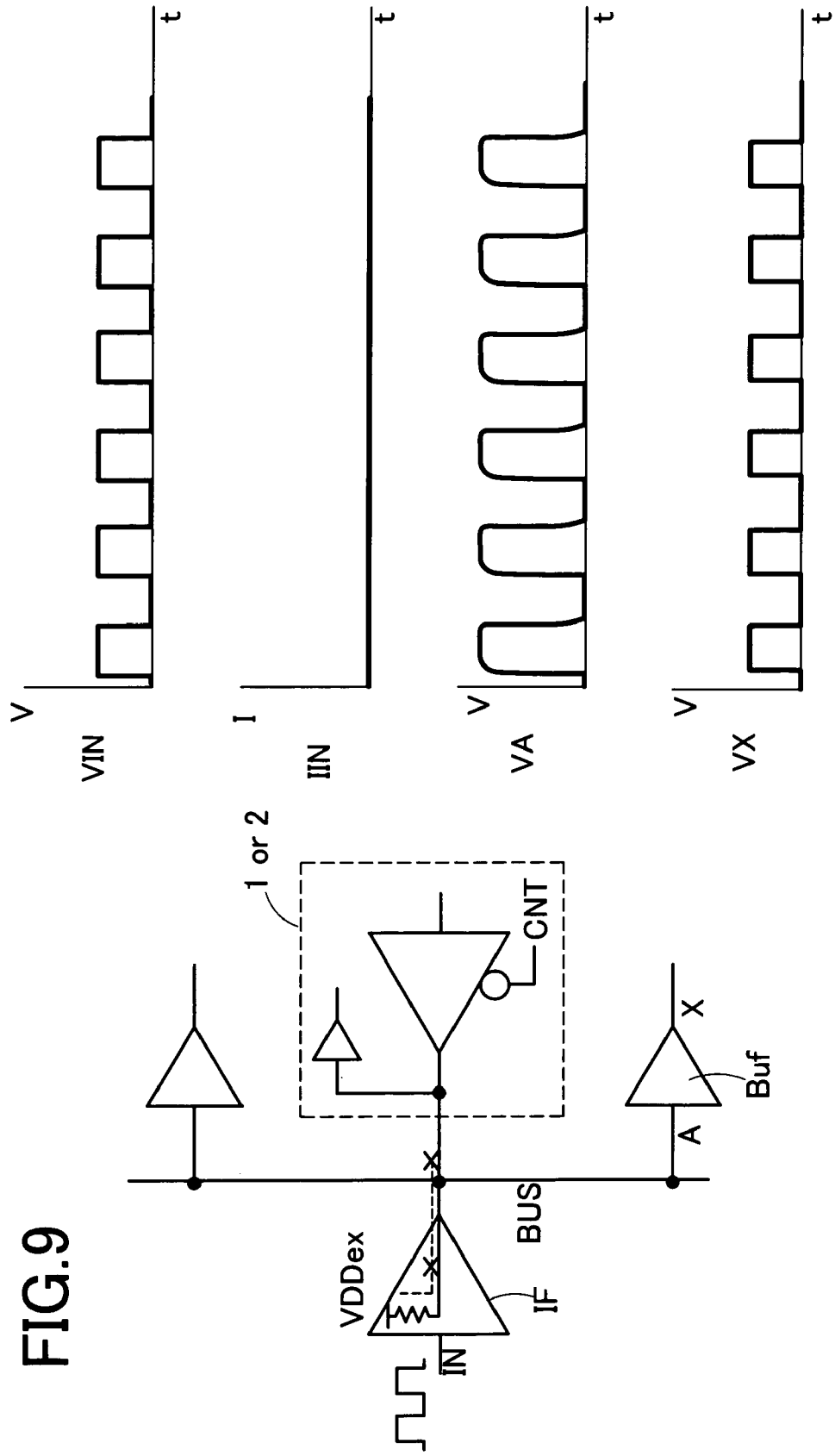
FIG. 9 is an explanatory view of a first operation state in the embodiment.
Figure 10:
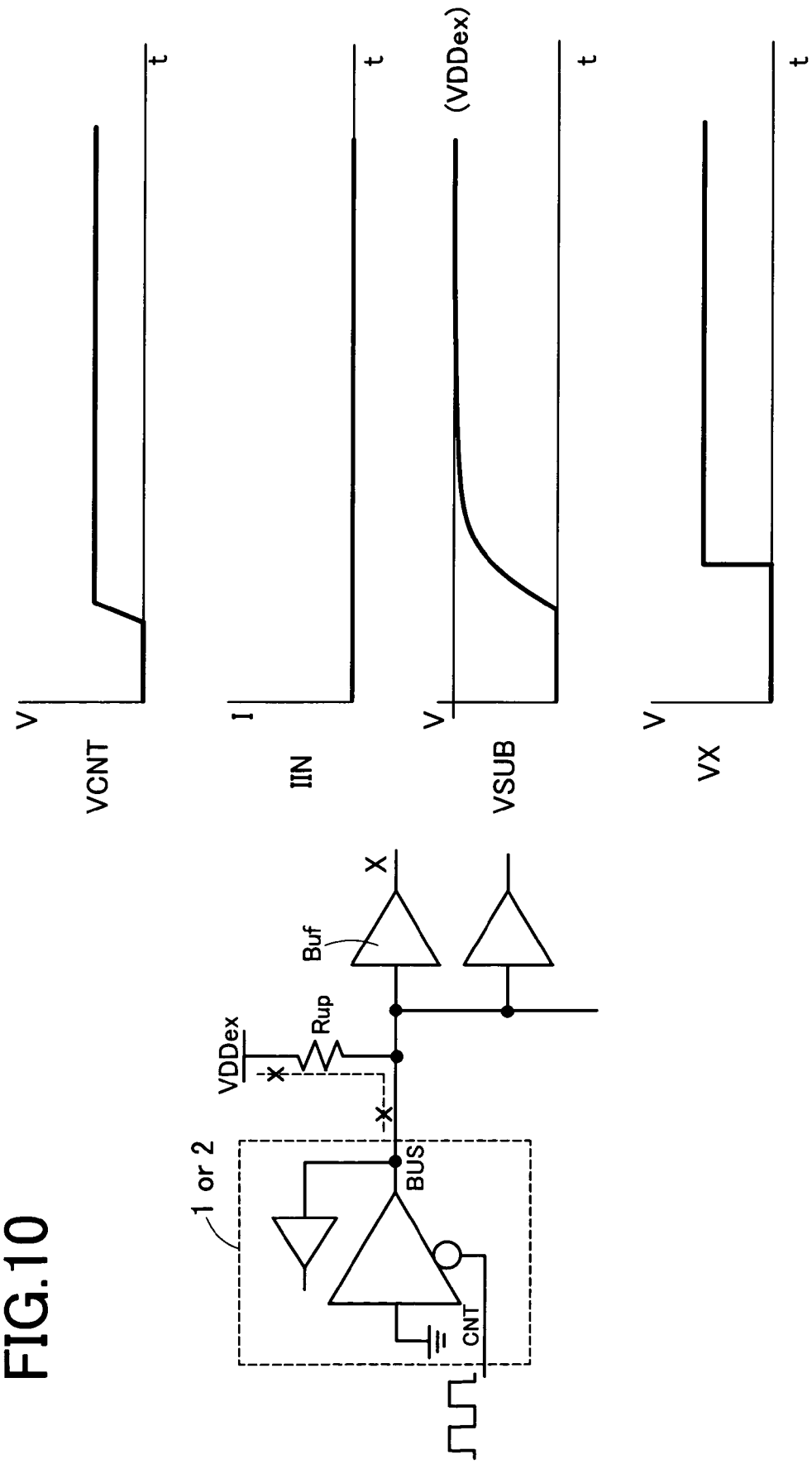
FIG. 10 is an explanatory view of a second operation state in the embodiment.
Figure 11:
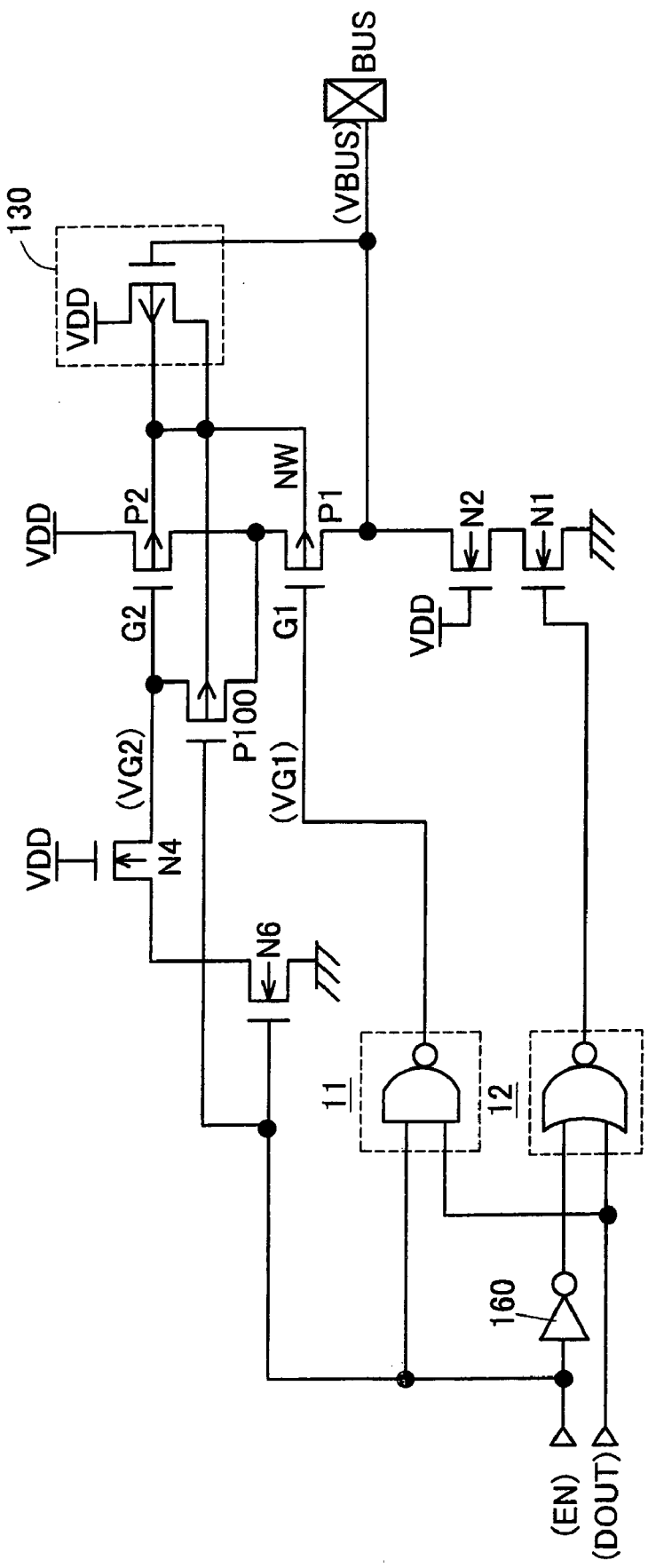
FIG. 11 is a circuit diagram of a semiconductor device of the prior art.

FIG. 9 and FIG. 10 show operation states in that, by using the input/output buffer circuits 1 and 2 of the first and second embodiments, applying voltages VBUS at voltage levels higher than those of their own power supply voltages are applied via the input/output terminal BUS.

Figure 12:
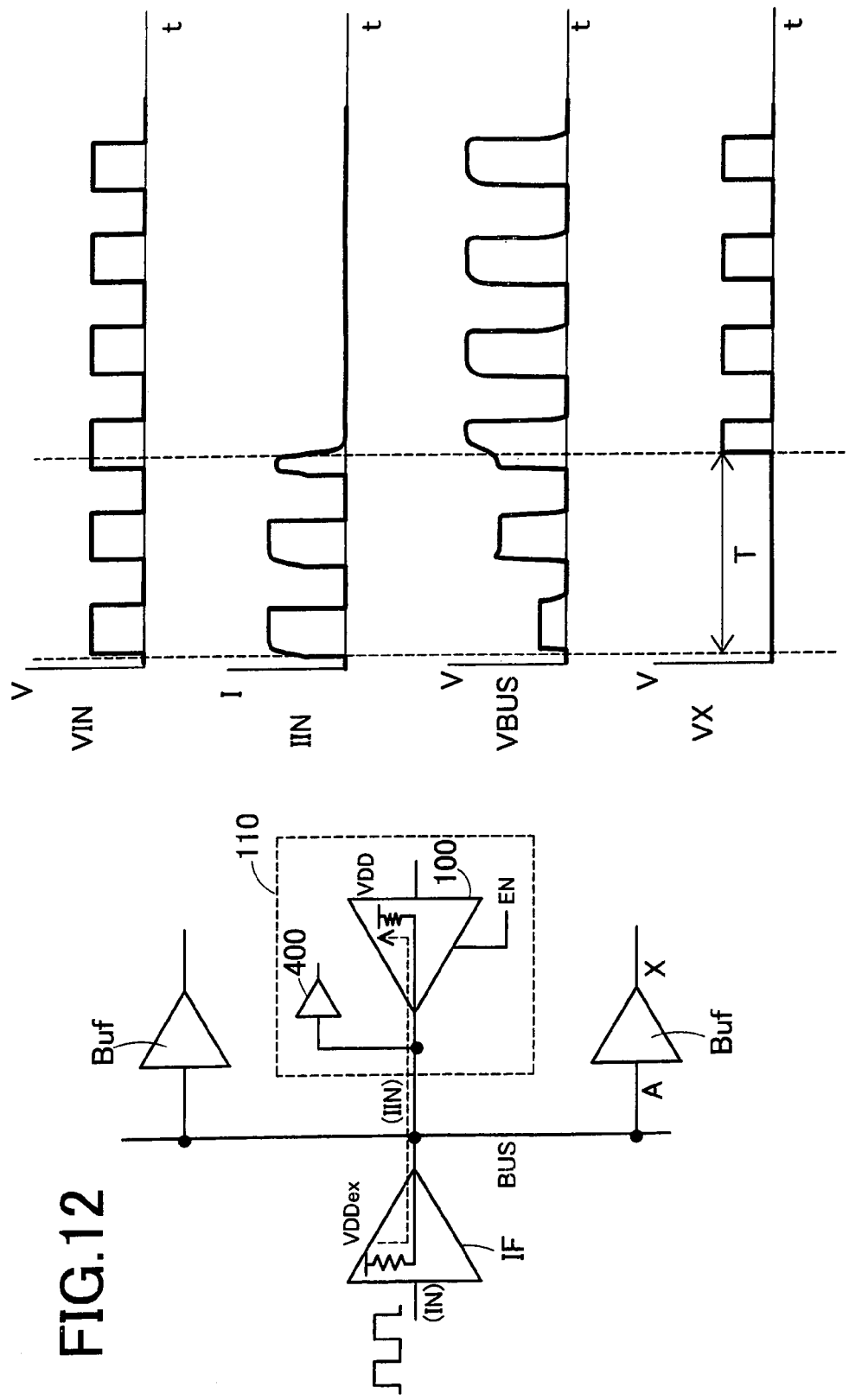
FIG. 12 is an explanatory view showing the first problem in the prior art.

The first operation state shown in FIG. 9 shows the case where an outputting state switches to a non-outputting state in that no undesirable current flows in the input/output buffer circuits 1 and 2 and the buffer circuit Buf can correctly recognize the power supply level VBUS of the input/output terminal BUS although the prior art has a problem (first problem of FIG. 12) in that a leak current IIN flows in the power supply voltage VDD through the input/output terminal BUS from the voltage VDDex supplied from the interface circuit IF and causes the buffer circuit Buf to be unable to correctly recognize the voltage level VBUS of the input/output terminal BUS when an outputting state switches to a non-outputting state. The output voltage VX is correctly outputted.

The second operation state shown in FIG. 10 proves that, when the bus line BUS is charged in the open-drain structure of the NMOS transistor, no undesirable current flows in the input/output buffer circuits 1 and 2 even during charging and the buffer circuit Buf can correctly recognize the power supply level VBUS of the input/output terminal BUS although the prior art has the problem (second problem of FIG. 13) in that charging takes time due to the external pull-up resistor Rup and a leak current IIN flows in the power supply voltage VDD from the voltage VDDex and causes the buffer circuit Buf to be unable to correctly recognize the voltage level VBUS. The output voltage VX is correctly outputted.

As described in detail above, in the input/output buffer circuits 1 and 2 of the first and second embodiments, in an inputting state as a non-outputting state, the gate terminal G2 of the PMOS transistor P2 does not float, and is set to at least the power supply voltage VDD. When an outputting state switches to an inputting state, in a case where the applying voltage VBUS to be applied to the input/output terminal BUS is equal to or higher than a voltage of the power supply voltage VDD plus the threshold voltage Vthp of the PMOS transistor, the gate terminal G2 is set to the applying voltage VBUS from the power supply voltage VDD in a short period of time. Therefore, no undesirable leak current flows in the power supply voltage source VDD from the input/output terminal BUS due to conduction through the PMOS transistor P2. Thereby, undesirable leak current flow into the input/output terminal BUS can be prevented. In addition, since no undesirable leak current flows, the voltage level of the applying voltage BUS does not change, and can be maintained at a predetermined voltage level.

Furthermore, in the PMOS transistor P2, the gate terminal G2 thereof is set to the power supply voltage VDD (VG2=VDD) by the gate drive part 8, and the PMOS transistor P2 is maintained as nonconductive at a voltage less than the voltage of the power supply voltage VDD plus the threshold voltage Vthp. In addition, at the voltage equal to or higher than the voltage of the power supply voltage VDD plus the threshold voltage Vthp, the gate terminal G2 is set to the applying voltage VBUS and maintained as nonconductive. Furthermore, in this case, no over voltage is applied to the gate drive part 8. In addition, no undesirable leak current flows to the power supply voltage VDD through the gate drive part 8 from the gate terminal G2, whereby undesirable leak current flow is prevented. Furthermore, since no leak current flows, the input/output terminal BUS can be set to a predetermined voltage level.

The voltage to be applied to the gate terminal G4 of the PMOS transistor P4 is limited to a voltage obtained by subtracting the threshold voltage Vthn of the NMOS transistor N5 from the power supply voltage VDD or the dropped voltage VDDL, and therefore, at a voltage less than the voltage of the power supply voltage VDD plus the threshold voltage Vthp, the PMOS transistor P4 can be made conductive without fail. The gate terminal G2 of the PMOS transistor P2 can be set to the power supply voltage VDD.

The invention is not limited to the above-described embodiments, and it is a matter of course that the invention can be variously altered and modified without deviating from the scope of the invention.

INDUSTRIAL APPLICABILITY

According to the invention, in both cases where a voltage signal higher than the own power supply voltage is applied to the output terminal or the input/output terminal, no undesirable leak current flows through the terminal. Therefore, when an external circuit is connected to the output terminal or the input/output terminal, the voltage level of the terminal voltage can be correctly set regardless of the voltage level applied to the output terminal or the input/output terminal, whereby signal outputting or inputting/outputting to the terminal BUS can be stably carried out.

What is claimed is:
1. semiconductor device in which a voltage signal higher than its own power supply voltage may be applied to an output terminal or an input/output terminal, comprising
a first PMOS transistor and a second PMOS transistor connected in series between a power supply voltage source and the output terminal or the input/output terminal, wherein
the gate terminal of the first PMOS transistor is maintained at the power supply voltage in a non-outputting state, and is driven according to an output signal in an outputting state, and
the gate terminal of the second PMOS transistor is set to an applying voltage to be applied to the output terminal or the input/output terminal in an non-outputting state when the applying voltage is in a first region in which the applying voltage is equal to or higher than a voltage of the power supply voltage plus a predetermined voltage, and
is set to the power supply voltage when the applying voltage is in a second region in which the applying voltage is less than the voltage of the power supply voltage plus the predetermined voltage.

2. The semiconductor device according to claim 1, wherein the voltage of the power supply voltage plus the predetermined voltage is the applying voltage applied when the second PMOS transistor starts conducting from the output terminal or the input/output terminal to the power supply voltage source in the case where the gate terminal is set to the power supply voltage.

3. The semiconductor device according to claim 1, wherein the predetermined voltage corresponds to a threshold voltage of the second PMOS transistor when the second PMOS transistor starts conducting from the output terminal or the input/output terminal to the power supply voltage source when the gate terminal is set to the power supply voltage.

4. The semiconductor device according to claim 1, comprising
a gate drive part which supplies the power supply voltage in an non-outputting state, and supplies a ground voltage in an outputting state; and
a first gate voltage control part which blocks application of the applying voltage to the gate drive part from the gate terminal of the second PMOS transistor in the first region, and supplies a voltage supplied from the gate drive part to the gate terminal of the second PMOS transistor in the second region and an outputting state, provided between the gate drive part and the gate terminal of the second PMOS transistor.

5. The semiconductor device according to claim 4, wherein
the first gate voltage control part has a third PMOS transistor that connects the gate drive part and the gate terminal of the second PMOS transistor, and
the third PMOS transistor becomes conductive in the second region.

6. The semiconductor device according to claim 5, wherein
the first gate voltage control part has a first transmission gate including the third PMOS transistor.

7. The semiconductor device according to claim 5, wherein a second gate voltage control part is provided which sets the gate terminal of the third PMOS transistor to the applying voltage in the first region, and sets the gate terminal to a voltage equal to or lower than the voltage at which the third PMOS transistor starts conducting from the power supply voltage in the second region.

8. The semiconductor device according to claim 7, wherein the voltage at which conduction starts corresponds to a threshold voltage of the third PMOS transistor.

9. The semiconductor device according to claim 7, wherein
the second gate voltage control part has a fourth PMOS transistor which connects the output terminal or the input/output terminal and the gate terminal of the third PMOS transistor, and has a gate terminal connected to the power supply voltage source.

10. The semiconductor device according to claim 7, wherein
the second gate voltage control part has a first NMOS transistor which connects the output terminal or the input/output terminal and the gate terminal of the third PMOS transistor, and
the gate terminal of the first NMOS transistor is set to the power supply voltage in an non-outputting state, and set to the ground voltage in an outputting state.

11. The semiconductor device according to claim 10, wherein in an non-outputting state, on the gate terminal of the first NMOS transistor, a dropped voltage is set in place of the power supply voltage.

12. The semiconductor device according to claim 11, wherein the dropped voltage is a dropped power supply voltage.

13. The semiconductor device according to claim 11, wherein
a voltage dropping part is provided, and
the dropped voltage is a voltage to be outputted from the voltage dropping part.

14. The semiconductor device according to claim 9, wherein
the second gate voltage control part has a second transmission gate including the fourth PMOS transistor or the first NMOS transistor.

15. The semiconductor device according to claim 10, wherein
the second gate voltage control part has a second transmission gate including the fourth PMOS transistor or the first NMOS transistor.

16. The semiconductor device according to claim 5, wherein the third PMOS transistor is maintained as conductive in an outputting state.

17. The semiconductor device according to claim 16, wherein
a second NMOS transistor is provided which connects the gate terminal of the third PMOS transistor and the ground voltage, and
the second NMOS transistor becomes conductive in an outputting state.

* * * * *